(12) United States Patent
Araki et al.

(10) Patent No.: US 8,749,047 B2
(45) Date of Patent: Jun. 10, 2014

(54) POWER MODULE

(75) Inventors: Shintaro Araki, Tokyo (JP); Korehide Okamoto, Fukuoka (JP); Khalid Hassan Hussein, Tokyo (JP); Mitsunori Aiko, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/310,023

(22) Filed: Dec. 2, 2011

(65) Prior Publication Data
US 2012/0228741 A1  Sep. 13, 2012

(30) Foreign Application Priority Data
Mar. 8, 2011 (JP) ................. 2011-050472

(51) Int. Cl.
H01L 23/48 (2006.01)
(52) U.S. Cl.
USPC ........................................ 257/693
(58) Field of Classification Search
CPC ... H01L 29/73; H01L 25/0753; H01L 27/082; H01L 23/047; H01L 23/538; H01L 23/3107; H01L 25/07; H01L 25/071; H01L 25/072
USPC ............... 257/565, 566, 577, 693, E27.053
See application file for complete search history.

(56) References Cited

U.S. PATENT DOCUMENTS

| | | | | |
|---|---|---|---|---|
| 3,577,633 A | * | 5/1971 | Homma et al. | 438/112 |
| 5,073,811 A | * | 12/1991 | Botti et al. | 257/577 |
| 6,072,240 A | * | 6/2000 | Kimura et al. | 257/735 |
| 6,101,114 A | * | 8/2000 | Kijima et al. | 363/132 |
| 7,057,273 B2 | | 6/2006 | Harnden et al. | |
| 2005/0051874 A1 | | 3/2005 | Ushijima | |
| 2012/0236500 A1 | * | 9/2012 | Higuchi et al. | 361/699 |

FOREIGN PATENT DOCUMENTS

| | | | |
|---|---|---|---|
| CN | 101467252 A | 6/2009 | |
| JP | 7-221264 | 8/1995 | |
| JP | 8-97459 | 4/1996 | |
| JP | 2003-229534 | 8/2003 | |
| JP | 2005-117728 | 4/2005 | |
| JP | 2007-110870 | 4/2007 | |
| JP | 2007-220976 | 8/2007 | |
| JP | 2010-199622 | 9/2010 | |
| WO | WO 2010/147199 | * 12/2010 | ............. H01L 25/07 |

OTHER PUBLICATIONS

Office Action issued Oct. 29, 2013 in Japanese Patent Application No. 2011-050472 (with partial English translation).
German Office Action issued Feb. 18, 2013, in German patent application No. 10 2012 201 080.7 (with English translation).
Chinese Office Action mailed Feb. 25, 2014 in Chinese Application No. 2012100691424 with English Translation.

* cited by examiner

*Primary Examiner* — Nikolay Yushin
(74) *Attorney, Agent, or Firm* — Oblon, Spivak, McClelland, Maier & Neustadt, L.L.P.

(57) ABSTRACT

A power module includes a first semiconductor device having a collector terminal and an emitter terminal which extend outwardly from a molded resin, wherein at least one of the collector and emitter terminals is a bilaterally extending terminal extending outwardly from two opposite surfaces of the molded resin, and a second semiconductor device having the same construction as the first semiconductor device. The bilaterally extending terminal of the first semiconductor device is connected to a bilaterally extending terminal of the second semiconductor device.

4 Claims, 10 Drawing Sheets

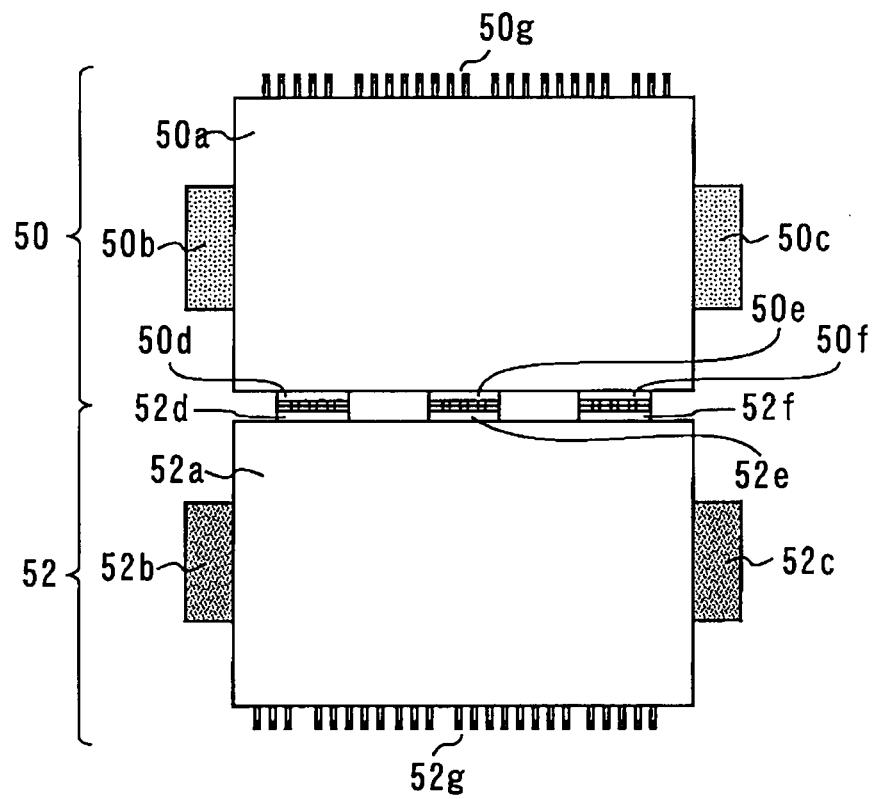
F I G. 7
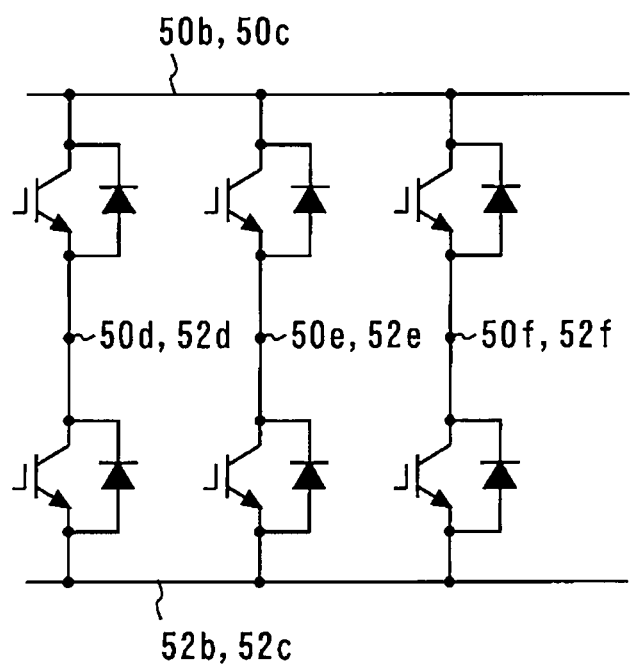
F I G. 8

POWER MODULE

BACKGROUND OF THE INVENTION

1. Field of the Invention

The present invention relates to a power module including a plurality of semiconductor devices.

2. Background Art

Japanese Laid-Open Patent Publication No. 2007-220976 discloses a power module in which a plurality of semiconductor devices are arranged to form an inverter circuit. This power module includes a power bus bar and a ground bus bar for connecting each semiconductor device to the power supply or ground.

The bus bars of the power module disclosed in the above patent publication limit the reduction in size of the module.

SUMMARY OF THE INVENTION

The present invention has been made to solve this problem. It is, therefore, an object of the present invention is to provide a power module of a reduced size.

According to one aspect of the present invention, a power module includes a first semiconductor device having a collector terminal and an emitter terminal which extend outwardly from a molded resin, wherein at least one of the collector and emitter terminals is a bilaterally extending terminal extending outwardly from two opposite surfaces of the molded resin, and a second semiconductor device having the same construction as the first semiconductor device. The bilaterally extending terminal of the first semiconductor device is connected to a bilaterally extending terminal of the second semiconductor device.

Other and further objects, features and advantages of the invention will appear more fully from the following description.

BRIEF DESCRIPTION OF THE DRAWINGS

FIG. 7 is a plan view of a variation of the power module of the first embodiment;

FIG. 8 is a circuit diagram of the structure shown in FIG. 7;

DETAILED DESCRIPTION OF THE PREFERRED EMBODIMENTS

First Embodiment

Figure 1:
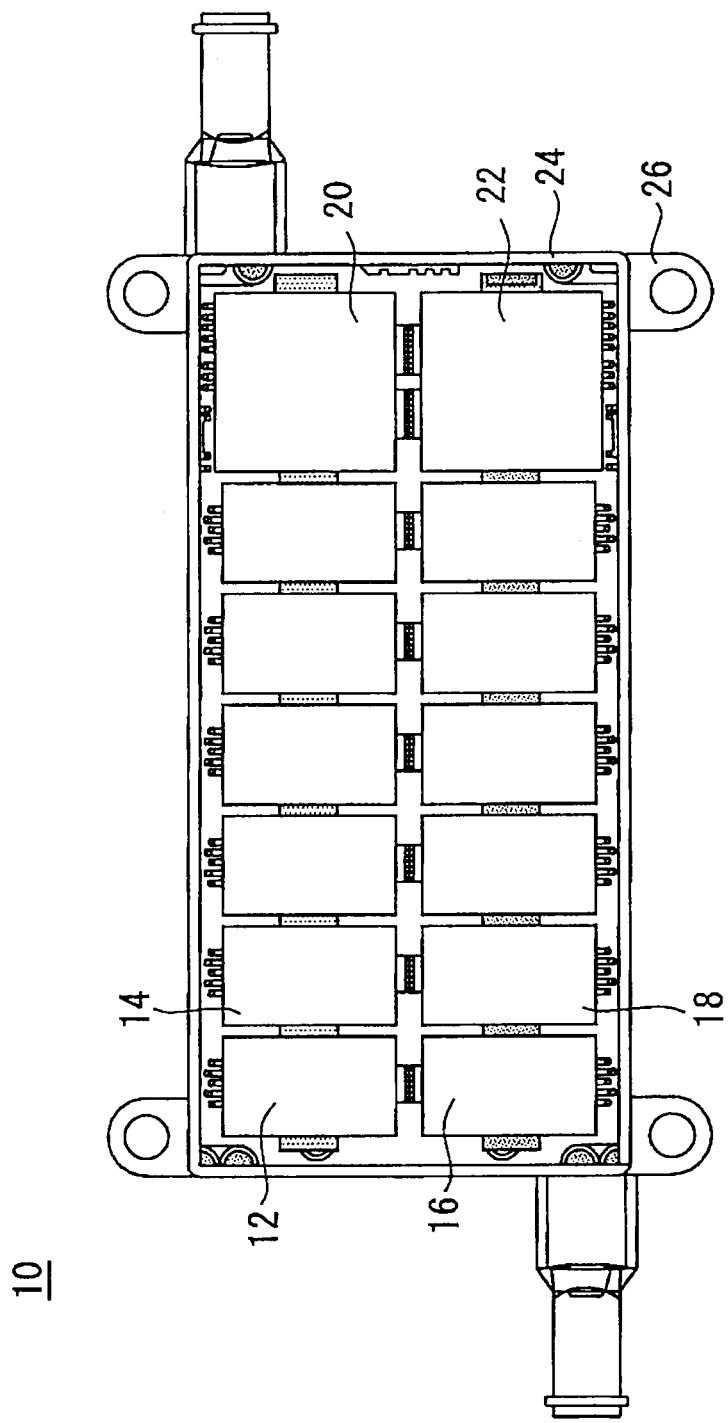
FIG. 1 is a plan view of a power module in accordance with a first embodiment of the present invention.

FIG. 1 is a plan view of a power module 10 in accordance with a first embodiment of the present invention. The power module 10 is used for switching of high currents, namely, 75 A or more. The power module 10 includes a first semiconductor device 12 and a second semiconductor device 14 which have the same construction. The power module 10 also includes four other semiconductor devices which are identical in construction to the first and second semiconductor devices 12 and 14. Further, the power module 10 also includes a third semiconductor device 16 and a fourth semiconductor device 18 which have the same construction. The power module 10 also includes four other semiconductor devices which are identical in construction to the third and fourth semiconductor devices 16 and 18. Further, the power module 10 also includes semiconductor devices 20 and 22 larger in size than the other semiconductor devices in the module. All the semiconductor devices described above are mounted in a case 24. The case 24 has formed thereon fixing portions 26 by which the power module 10 can be fixed to an external device, etc.

Figure 2:
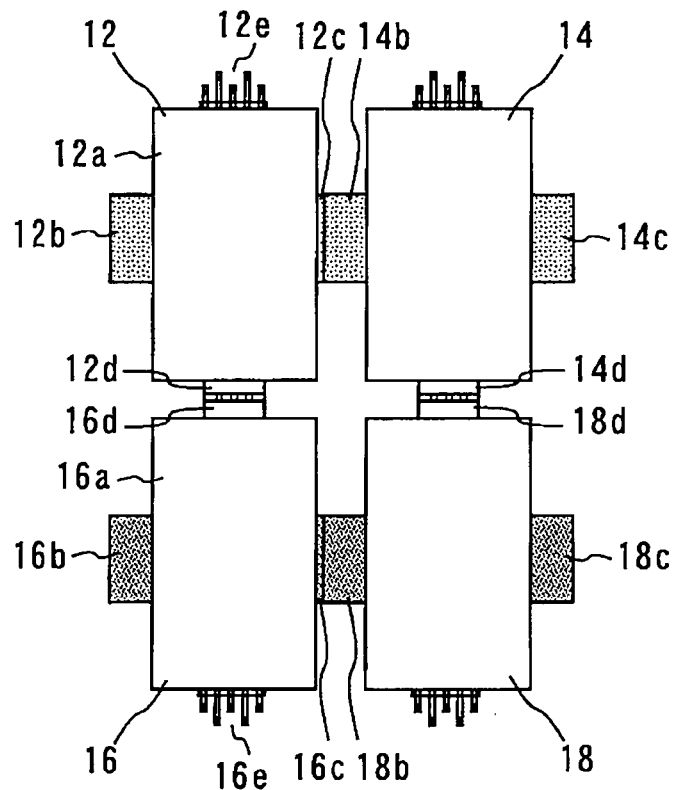
FIG. 2 is an enlarged view of the first to fourth semiconductor devices.

FIG. 2 is an enlarged view of the first to fourth semiconductor devices 12, 14, 16, and 18. The first semiconductor device 12 has a molded resin 12a which covers power semiconductor elements. The terminals extending outwardly from the molded resin 12a are collector terminals 12b and 12c, an emitter terminal 12d, and a gate-emitter interconnection terminal 12e. The collector terminals 12b and 12c extend outwardly from two opposite surfaces, respectively, of the molded resin 12a and electrically connected together within the semiconductor device so as to allow a large current to pass through these terminals. That is, these collector terminals 12b and 12c together form a single extending terminal whose two ends extend outwardly from two opposite surfaces, respectively, of the molded resin 12a. Such an extending terminal may be hereinafter referred to as a "bilaterally extending terminal." The emitter terminal 12d extends outwardly from a different surface of the molded resin 12 than those from which the bilaterally extending terminal extends outwardly. The gate-emitter interconnection terminal 12e includes a gate terminal for controlling a power semiconductor element, a current detection output terminal, and a temperature detection output terminal, etc., and is made up of thinner leads than the collector and emitter terminals.

The collector terminal 12c of the first semiconductor device 12 is directly connected to a collector terminal 14b of the second semiconductor device 14 by solder. That is, the bilaterally extending terminal of the first semiconductor device 12 is connected to that of the second semiconductor device 14 by solder. Although the following description assumes that connection of terminals is achieved by soldering, it is to be understood that other connection methods such as welding and screwing may be used.

The third semiconductor device 16 has a molded resin 16a which covers power semiconductor elements. The terminals extending outwardly from the molded resin 16a are emitter terminals 16b and 16c, a collector terminal 16d, and a gate-emitter interconnection terminal 16e. The emitter terminals 16b and 16c together form a bilaterally extending terminal. The collector terminal 16d extends outwardly from a different surface of the molded resin 16a than those from which the bilaterally extending terminal extends outwardly.

The emitter terminal 16c of the third semiconductor device 16 is connected to an emitter terminal 18b of the fourth semiconductor device 18. That is, the bilaterally extending terminal of the third semiconductor device 16 is connected to that of the fourth semiconductor device 18.

The emitter terminal 12d of the first semiconductor device 12 is connected to the collector terminal 16d of the third semiconductor device 16, and the emitter terminal 14d of the second semiconductor device 14 is connected to the collector terminal 18d of the fourth semiconductor device 18.

Figure 3:
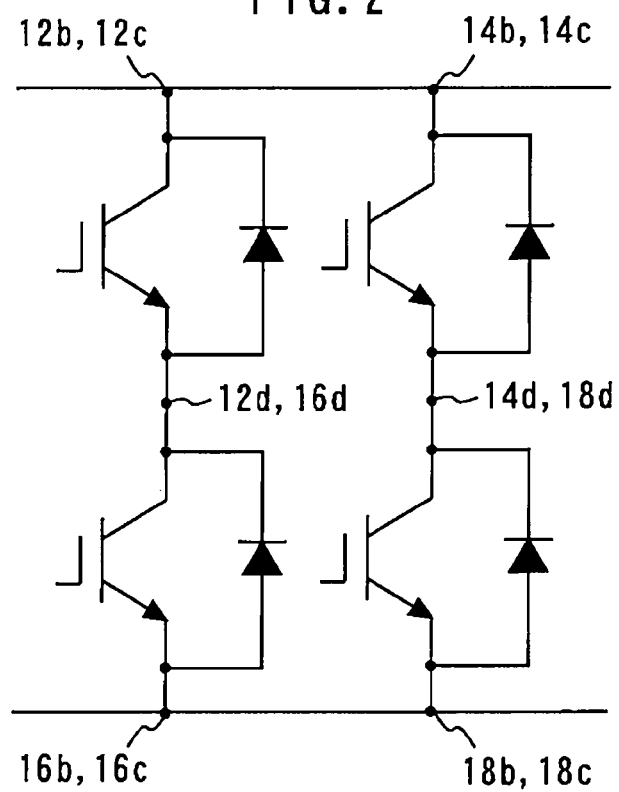
FIG. 3 is a circuit diagram of the structure shown in FIG. 2.

FIG. 3 is a circuit diagram of the structure shown in FIG. 2. Each of the first to fourth semiconductor devices 12, 14, 16, and 18 includes two power semiconductor elements, namely, an IGBT and an FwDi (freewheeling diode). The first semiconductor device 12 and the third semiconductor device 16 together form one arm, and the second semiconductor device 14 and the fourth semiconductor device 18 together form another arm. Thus, as shown in FIG. 1, the power module 10 includes 6 semiconductor devices having a bilaterally extending collector terminal, and further includes 6 semiconductor devices having a bilaterally extending emitter terminal. These semiconductor devices are connected to form an inverter unit.

Figure 4:
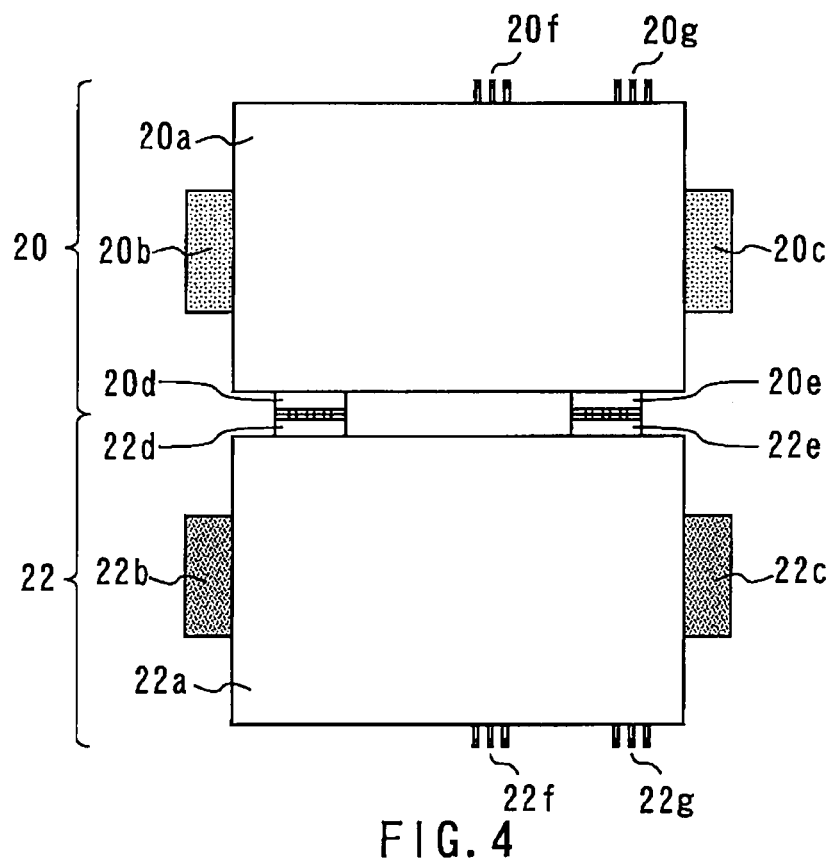
FIG. 4 is an enlarged view of the semiconductor devices.

FIG. 4 is an enlarged view of the semiconductor devices 20 and 22. The semiconductor devices 20 and 22 form the converter unit of the power module. The semiconductor device 20 has a molded resin 20a which covers power semiconductor elements. The terminals extending outwardly from the molded resin 20a are collector terminals 20b and 20c, emitter terminals 20d and 20e, and gate-emitter interconnection terminals 20f and 20g. The collector terminals 20b and 20c together form a bilaterally extending terminal. The emitter terminals 20d and 20e extend outwardly from a different surface of the molded resin 20a than those from which the bilaterally extending terminal extends outwardly.

The semiconductor device 22 has a molded resin 22a which covers power semiconductor elements. The terminals extending outwardly from the molded resin 22a are emitter terminals 22b and 22c, collector terminals 22d and 22e, and gate-emitter interconnection terminals 22f and 22g. The emitter terminals 22b and 22c together form a bilaterally extending terminal. The collector terminals 22d and 22e extend outwardly from a different surface of the molded resin 22a than those from which the bilaterally extending terminal extends outwardly. The emitter terminals 20d and 20e of the semiconductor device 20 are connected to the collector terminals 22d and 22e, respectively, of the semiconductor device 22.

Figure 5:
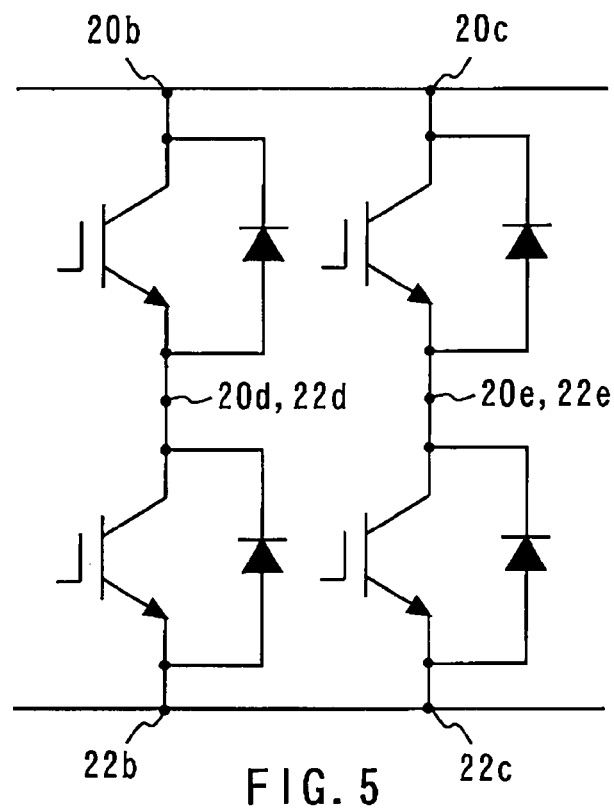
FIG. 5 is a circuit diagram of the structure shown in FIG. 4.

FIG. 5 is a circuit diagram of the structure shown in FIG. 4. Each of the semiconductor devices 20 and 22 includes two IGBTs and two FwDis. The emitter terminal 20d of the semiconductor device 20 and the collector terminal 22d of the semiconductor device 22 are connected together to form one arm, and the emitter terminal 20e of the semiconductor device 20 and the collector terminal 22e of the semiconductor device 22 are connected together to form another arm.

Figure 6:
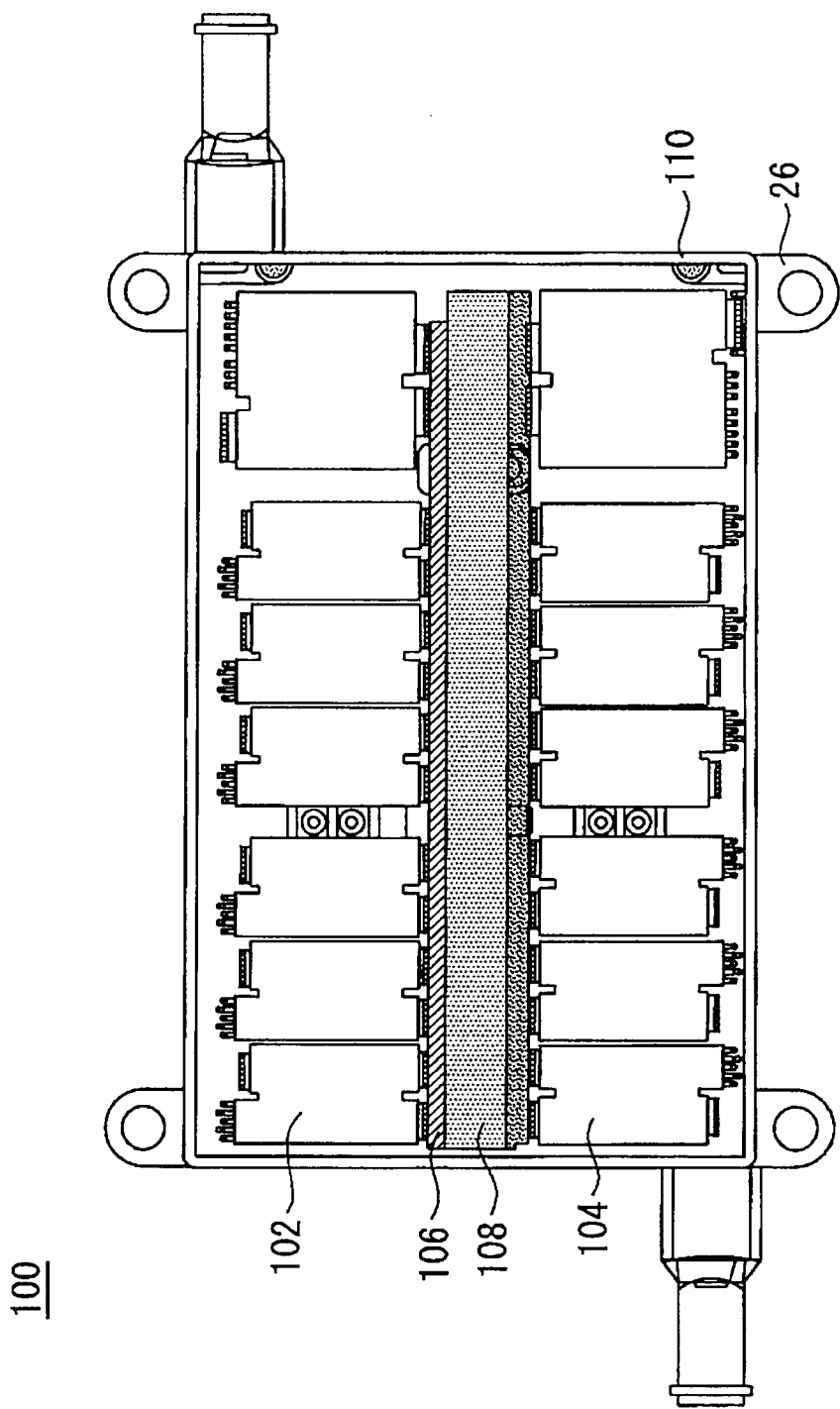
FIG. 6 is a plan view of comparative power module.

Before describing the power module 10 of the first embodiment, and to facilitate the understanding thereof, the following description will be directed to a comparative conventional power module. FIG. 6 is a plan view of this comparative power module 100. The power module 100 includes semiconductor devices 102 and 104. These semiconductor devices are interconnected by a power bus bar 106 and a ground bus bar 108. The other semiconductor devices in the power module 100 are also interconnected in the same manner. Thus, all semiconductor devices and all bus bars in the power module 100 are mounted in the case 110 of the power module 100. The use of bus bars for interconnecting the semiconductor devices in a power module such as the comparative power module 100 requires that the case of the power module have space therein for accommodating these bus bars, which limits the reduction in size of the power module.

The power module 10 of the first embodiment, on the other hand, does not require bus bars, making it possible to reduce the size of the module. Specifically, the collector terminals of the semiconductor devices in the upper arms (which collector terminals must be connected to one another) are bilaterally extending terminals. Since these bilaterally extending terminals extend outwardly from two opposite sides of the molded resins of their respective semiconductor devices, they can be connected together so as to function as a power bus bar. Likewise, the emitter terminals of the semiconductor devices in the lower arms (which emitter terminals must be connected to one another) are also bilaterally extending terminals. Therefore, they can be connected together so as to function as a ground bus bar. Therefore, there is no need for the power module 10 to have bus bars.

Further, the emitter terminal of the semiconductor device in each upper arm such as the semiconductor device 12 extends from a different surface of the molded resin of the device than those from which the bilaterally extending terminal (i.e., the collector terminal) extends outwardly. Further, the collector terminal of the semiconductor device in each lower arm such as the semiconductor device 16 extends from a different surface of the molded resin of the device than those from which the bilaterally extending terminal (i.e., the emitter terminal) extends outwardly. Therefore, the emitter terminal in the upper arm can be directly connected to the collector terminal in the lower arm.

Thus, in each semiconductor device of the power module 10 of the first embodiment, at least one of the collector and emitter terminals of a power semiconductor element (IGBT) covered with the molded resin is a bilaterally extending terminal. As a result, these bilaterally extending terminals of the semiconductor devices of the power module 10 can be connected to one another, thereby eliminating the need for a bus bar resulting in a reduced size of the power module 10.

Although each semiconductor device in the power module 10 of the first embodiment includes one or two IGBTs, it is to be understood that the present invention is not limited to these numbers of IGBTs. For example, each semiconductor device may include three IGBTs, as shown in FIGS. 7 and 8. FIG. 7 is a plan view of a variation of the power module of the first embodiment. Further, FIG. 8 is a circuit diagram of the structure shown in FIG. 7. Referring to FIGS. 7 and 8, a semiconductor device 50 includes collector electrodes 50b and 50c which together form a bilaterally extending terminal. This bilaterally extending terminal serves as a high voltage line (or high voltage power line or P line) of phases (or arms) each including two series-connected power semiconductor elements.

Referring further to FIGS. 7 and 8, a semiconductor device 52 includes emitter electrodes 52b and 52c which together form a bilaterally extending terminal. This bilaterally extending terminal serves as a low voltage line (or low voltage power line or N line) of the phases (or arms) each including the two series-connected power semiconductor elements. Further, the emitter electrodes 50d, 50e, and 50f of the semiconductor device 50 are connected to the collector electrodes 52d, 52e, and 52f, respectively, of the semiconductor device 52. Thus, these semiconductor devices are configured to together form a three-phase AC inverter, and the P line and the N line are bilaterally extending terminals. It should be noted that reference numerals 50a and 52a denote molded resins, and 50g and 52g denote gate-emitter interconnection terminals.

Various other alterations may be made to the first embodiment. For example, although the power module 10 of the first embodiment is adapted for switching of high currents, namely, 75 A or more, it is to be understood that the embodiment may be applied to any suitable module that contains a plurality of semiconductor devices with collector and emitter terminals while still providing the advantages of the present invention. Further, instead of soldering, other methods such as welding and screwing may be used to connect the terminals. Further, the power semiconductor elements in each semiconductor device of the power module are not limited to IGBTs and FwDis. They may be power MOSFETs.

Second Embodiment

Figure 9:
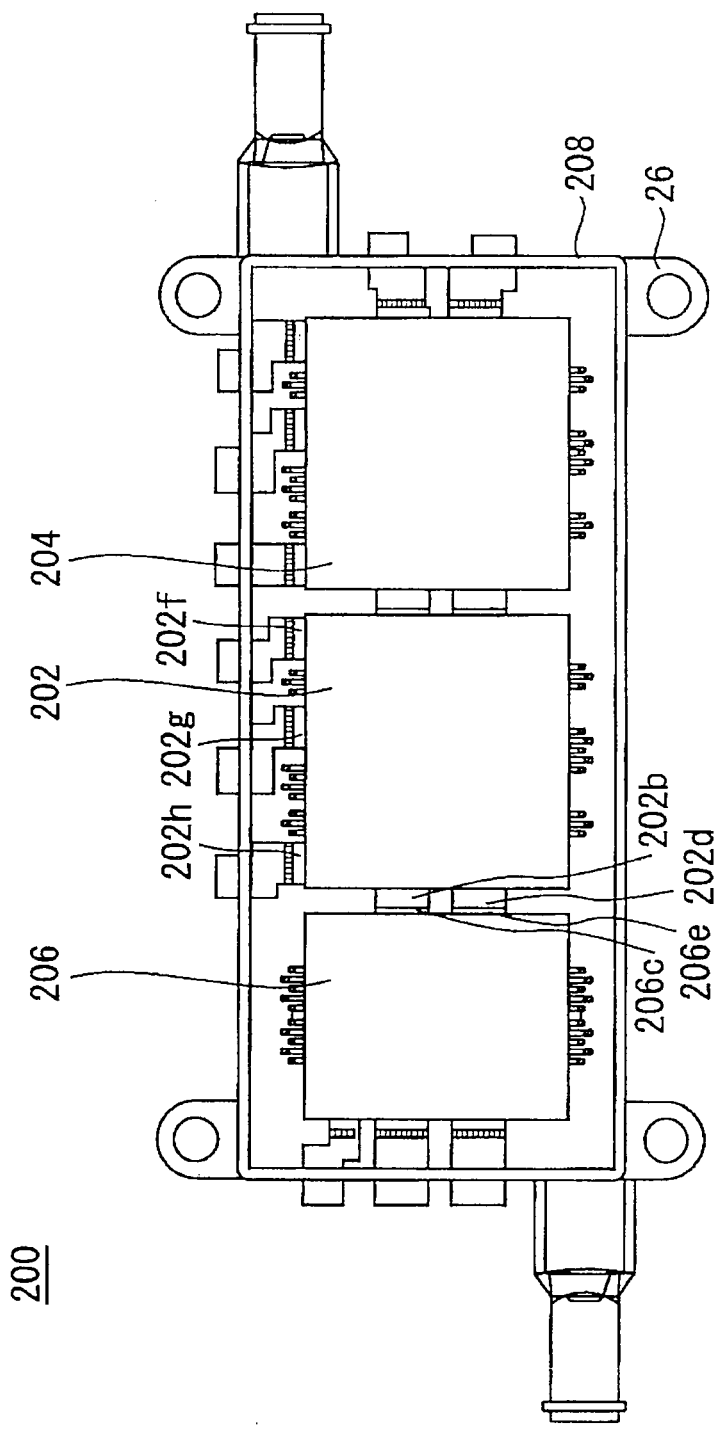
FIG. 9 is a plan view of a power module in accordance with a second embodiment of the present invention.

FIG. 9 is a plan view of a power module 200 in accordance with a second embodiment of the present invention. The power module 200 includes a first semiconductor device 202, a second semiconductor device 204, and a third semiconductor device 206. All of these semiconductor devices are mounted in a case 208. The case 208 has formed thereon fixing portions 26 by which the power module 200 can be fixed to an external device, etc.

Figure 10:
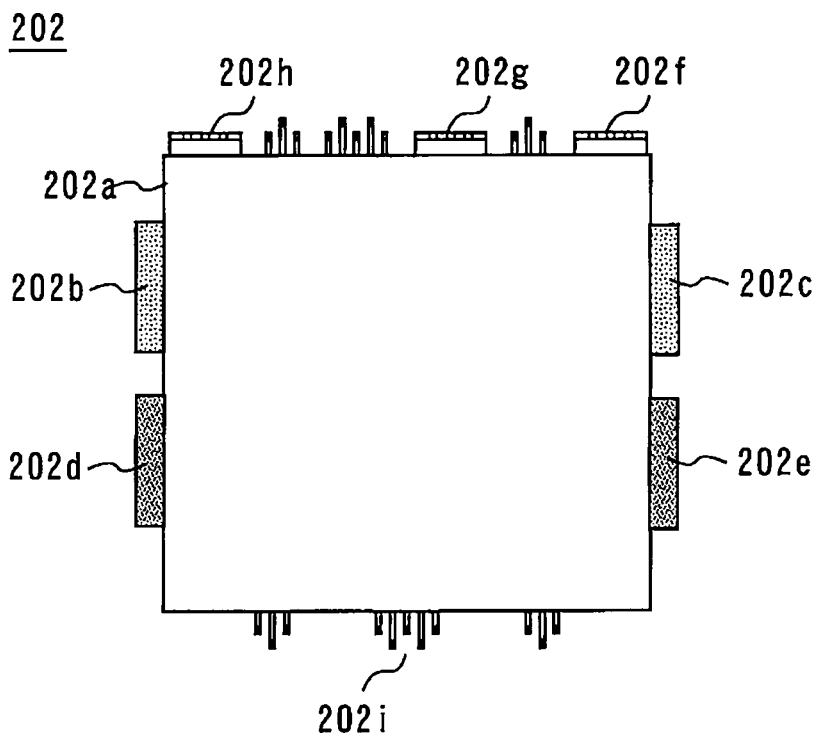
FIG. 10 is an enlarged view of the first semiconductor device.

FIG. 10 is an enlarged view of the first semiconductor device 202. The first semiconductor device 202 is a three-phase inverter circuit such as that shown in FIG. 8. (That is, the inverter circuit has three phases (or arms) each including two series-connected power semiconductor elements.) This means that the first semiconductor device 202 is a combination of the semiconductor devices 50 and 52 shown in FIG. 7. The first semiconductor device 202 has a molded resin 202a, as shown in FIG. 10. The terminals extending outwardly from the molded resin 202a are collector terminals 202b and 202c, emitter terminals 202d and 202e, and neutral terminals 202f, 202g, and 202h, and a gate-emitter interconnection terminal 202i.

The collector terminals 202b and 202c together form a bilaterally extending terminal, and the emitter terminals 202d and 202e together form a bilaterally extending terminal. The collector terminal 202b and the emitter terminal 202d extend outwardly from the same surface of the molded resin 202a, and the collector terminal 202c and the emitter terminal 202e extend outwardly from the same surface of the molded resin 202a. The neutral terminals 202f, 202g, and 202h extend outwardly from a different surface of the molded resin 202a than those from which the bilaterally extending terminals extend outwardly.

The second semiconductor device 204 has the same construction as the first semiconductor device 202. A collector terminal of the first semiconductor device 202 is connected to a collector terminal of the second semiconductor device 204, and an emitter terminal of the first semiconductor device 202 is connected to an emitter terminal of the second semiconductor device 204.

Figure 11:
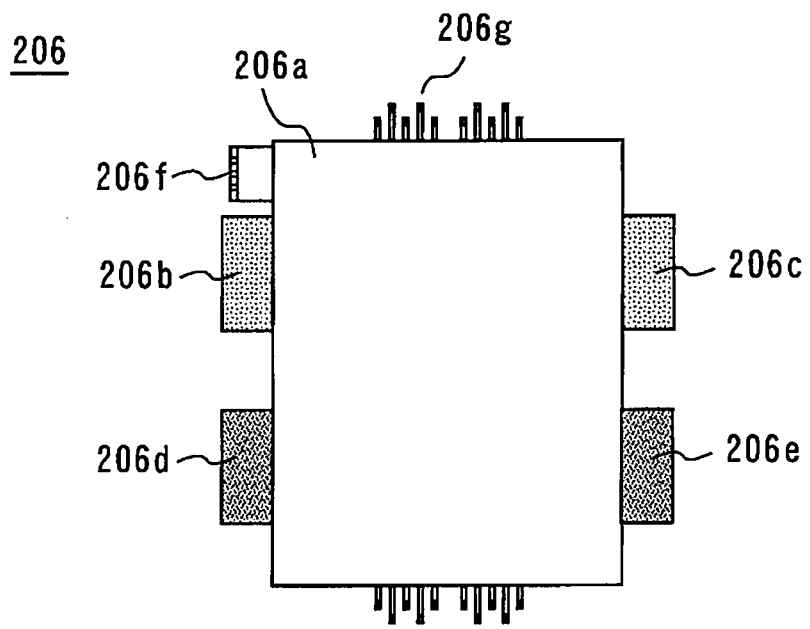
FIG. 11 is an enlarged view of the third semiconductor device.

FIG. 11 is an enlarged view of the third semiconductor device 206. The third semiconductor device 206 includes one phase (or arm). As shown in FIG. 11, the third semiconductor device 206 has a molded resin 206a. The terminals extending outwardly from the molded resin 206a are collector terminals 206b and 206c, emitter terminals 206d and 206e, a neutral terminal 206f, and a gate-emitter interconnection terminal 206g. The collector terminals 206b and 206c together form a bilaterally extending terminal, and the emitter terminals 206d and 206e together form a bilaterally extending terminal. The collector terminal 206b and the emitter terminal 206d extend outwardly from the same surface of the molded resin 206a, and the collector terminal 206c and the emitter terminal 206e extend outwardly from the same surface of the molded resin 206a.

As shown in FIG. 9, the collector terminal 206c of the third semiconductor device 206 is connected to the collector terminal 202b of the first semiconductor device 202, and the emitter terminal 206e of the third semiconductor device 206 is connected to the emitter terminal 202d of the first semiconductor device 202. The neutral terminals 202f, 202g, and 202h are connected through conductors to the respective external connection terminals provided on a side of the case 208. The neutral terminals of the second semiconductor device 204 and the neutral terminal 206f of the third semiconductor device 206 are also connected to the respective external connection terminals on sides of the case 208 in the same manner as the neutral terminals of the first semiconductor device 202. Further, the collector terminal and the emitter terminal of the second semiconductor device 204 which directly face a side of the case 208 are connected through conductors to the respective external connection terminals on that side of the case. Further, the collector terminal 206b and the emitter terminal 206d of the third semiconductor device 206, which directly face a side of the case 208, are also connected through conductors to the respective external connection terminals on that side of the case.

In the power module 200 of the second embodiment, the semiconductor device 202 is a complete three-phase inverter circuit and the semiconductor device 206 is a complete converter unit, resulting in a simplified construction and reduced size of the power module. This construction facilitates the manufacture of, e.g., an HEV-IPM for a vehicle-running and regenerative braking system. Although the power module includes two inverters, namely, the first semiconductor device 202 and the second semiconductor device 204 (e.g., for vehicle running and for regenerative braking, respectively), it is to be understood that the module may include only the first semiconductor device 202.

Figure 12:
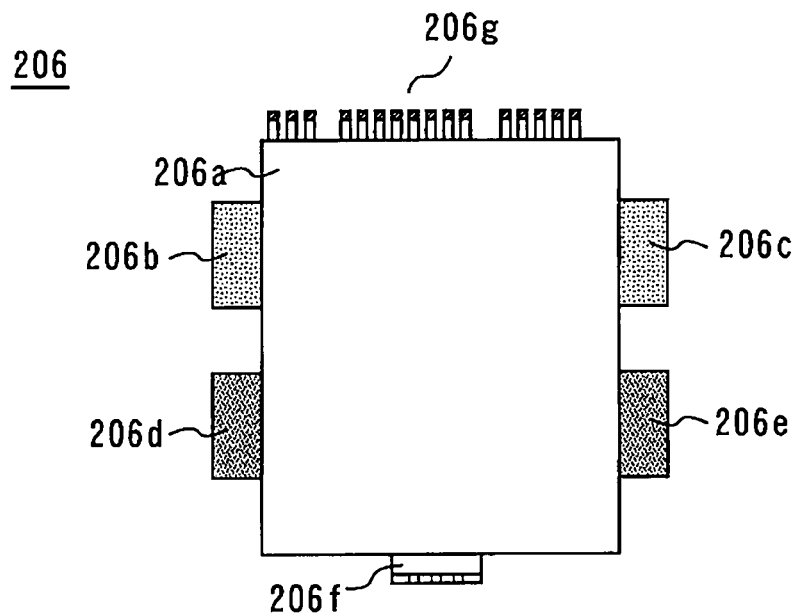
FIG. 12 is a plan view showing a variation of the third semiconductor device.

Various alterations may be made to the power module 200 of the second embodiment. For example, although the neutral terminal 206f and the collector terminal 206b are shown in FIG. 11 to extend in the same direction, they may not extend in the same direction. In FIG. 12, for example, the neutral terminal 206f and the collector terminal 206b extend in different directions. FIG. 12 is a plan view showing a variation of the third semiconductor device 206, wherein the neutral terminal 206f extends in a different direction than the bilaterally extending terminals (or collector and emitter terminals). In addition to this, the second embodiment is susceptible of at least alterations which are the same as or correspond to those that can be made to the first embodiment.

Third Embodiment

Figure 13:
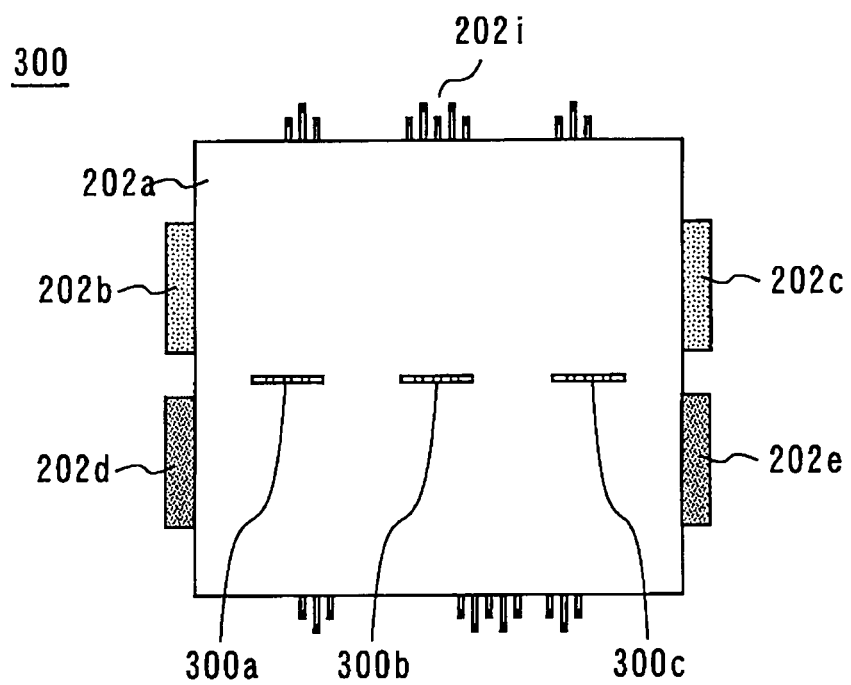
FIG. 13 is a plan view of a semiconductor device in accordance with a third embodiment of the present invention.
Figure 14:
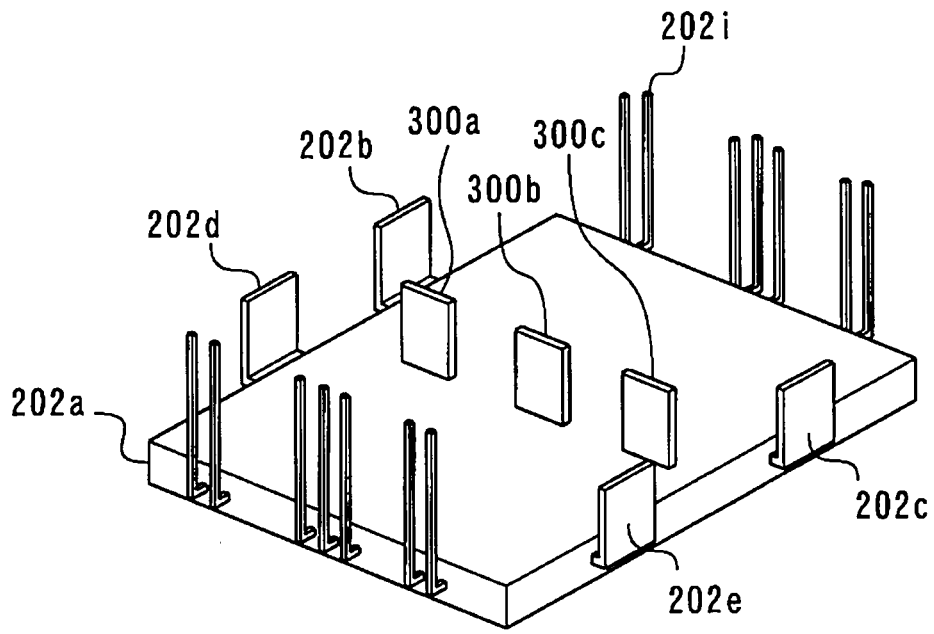
FIG. 14 is a perspective view of the semiconductor device.

FIG. 13 is a plan view of a semiconductor device 300 in accordance with a third embodiment of the present invention. The semiconductor device 300 of the third embodiment is a three-phase inverter circuit. The neutral terminals 300a, 300b, and 300c of the three phases (or arms), respectively, of the inverter extend from directly above the neutral points of their respective arms within a molded resin 202a outwardly from the largest surface (or top surface) of the molded resin 202a. FIG. 14 is a perspective view of the semiconductor device 300. The neutral terminals 300a, 300b, and 300c extend outwardly and perpendicularly from the central portion of a different surface of the molded resin 202a than those from which the bilaterally extending terminals extend. It should be noted that the semiconductor device 300 is similar to the semiconductor device 202 of the second embodiment described with reference to FIG. 10, except that the neutral terminals 202f, 202g, and 202h are replaced by the neutral terminals 300a, 300b, and 300c. Therefore, parts identical to those of the semiconductor device 202 bear the same reference numerals and will not be described herein.

In accordance with the construction of the semiconductor device of the third embodiment, the distance between the neutral point of each phase (or arm) and its neutral terminal within the molded resin 202a can be reduced, resulting in reduced wiring inductance. Although the semiconductor device 300 is a three-phase inverter circuit, it is to be understood that the present embodiment is not limited to this particular semiconductor device, but may be applied to any suitable inverter circuit with one or more arms while still providing the advantages of the present invention. Further, the third embodiment is susceptible of at least alterations which are the same as or correspond to those that can be made to the first embodiment.

Fourth Embodiment

Figure 15:
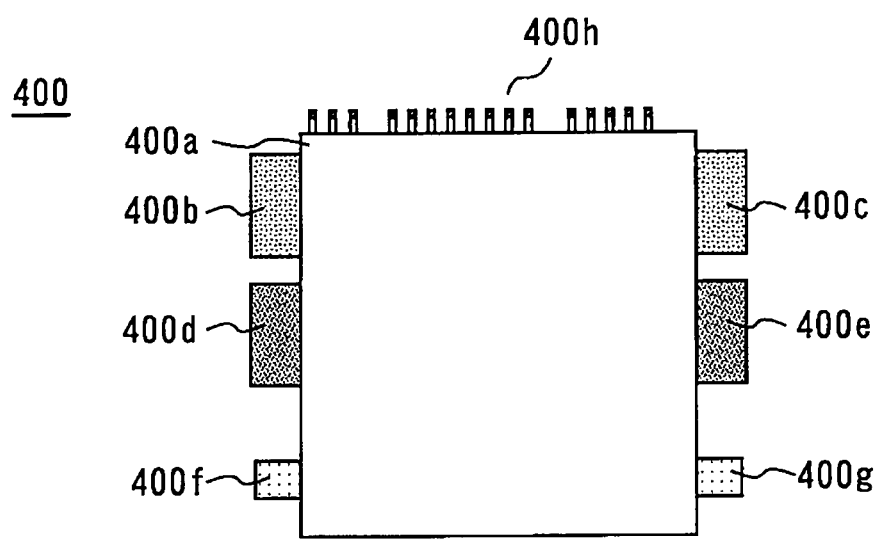
FIG. 15 is a plan view of a semiconductor device in accordance with a fourth embodiment of the present invention.

FIG. 15 is a plan view of a semiconductor device 400 in accordance with a fourth embodiment of the present invention. The semiconductor device 400 of the fourth embodiment is an inverter circuit having one phase (or arm). Referring to FIG. 15, collector terminals 400b and 400c, emitter terminals 400d and 400e, neutral terminals 400f and 400g, and a gate-emitter interconnection terminal 400h extend outwardly from a molded resin 400a. This semiconductor device 400 is characterized in that the neutral terminals 400f and 400g together form a bilaterally extending terminal in addition to the fact that the collector terminals 400b and 400c together form a bilaterally extending terminal and the emitter terminals 400d and 400e together form a bilaterally extending terminal.

Since in the semiconductor device 400 of the fourth embodiment the neutral terminals 400f and 400g together form a laterally extending terminal, a plurality of the semiconductor devices 400 may be connected in parallel by connecting their collector terminals, emitter terminals, and neutral terminals. This makes it possible to easily increase the current capacity of the power module and thereby enable the module to be used in various systems.

Figure 16:
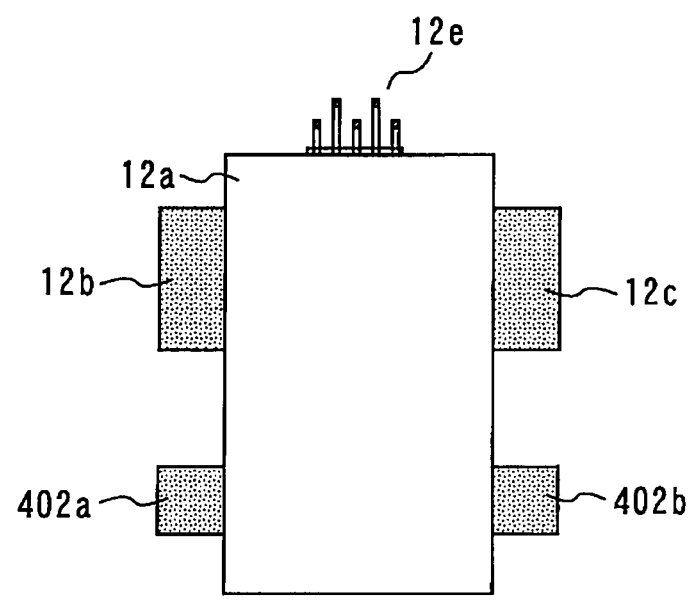
FIG. 16 is a plan view showing a variation of the semiconductor device of the fourth embodiment.

Although the semiconductor device 400 of the fourth embodiment is an inverter circuit having only one phase (or arm), it is to be understood that the present invention is not limited to this particular type of inverter circuit. For example, the fourth embodiment may be applied to a semiconductor device which constitutes the upper arms or lower arms of two phases (or arms), or both the upper arms and lower arms; that is, neutral terminals of such a semiconductor device may together form a bilaterally extending terminal, thereby providing the advantages of the present invention. FIG. 16 shows a semiconductor device which constitutes an upper arm. Specifically, FIG. 16 is a plan view showing a variation of the semiconductor device of the fourth embodiment. This semiconductor device 402 is similar to the semiconductor device 12 shown in FIG. 2, except that the emitter terminal 12d is replaced by emitter terminals 402a and 402b which together form a bilaterally extending terminal. Therefore, parts identical to those of the semiconductor device 12 bear the same reference numerals and will not be described herein. It should be noted that the semiconductor device of the fourth embodiment is susceptible of at least alterations which are the same as or correspond to those that can be made to the semiconductor devices of the first embodiment.

The power module of the present invention includes a plurality of semiconductor devices each having at least one terminal which extends outwardly from the left and right sides of a molded resin. These terminals of the semiconductor devices are connected to one another, thereby eliminating the need for a bus bar resulting in a reduced size of the power module.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-050472, filed on Mar. 8, 2011 including specification, claims, drawings and summary, on which the Convention priority of the present application is based, are incorporated herein by reference in its entirety.

What is claimed is:

1. A power module comprising:
a first semiconductor device having a collector terminal and an emitter terminal which extend outwardly from a molded resin, wherein at least one of said collector and emitter terminals is a bilaterally extending terminal extending outwardly from two opposite surfaces of said molded resin;
a second semiconductor device having the same construction as said first semiconductor device;
wherein said bilaterally extending terminal of said first semiconductor device is connected to a bilaterally extending terminal of said second semiconductor device, and
a third semiconductor device having an emitter terminal and a collector terminal, said emitter terminal being a bilaterally extending terminal extending outwardly from two opposite surfaces of a molded resin, said collector terminal extending outwardly from said molded resin,
wherein said bilaterally extending terminal of said first semiconductor device is said collector terminal, and
wherein said emitter terminal of said first semiconductor device is connected to said collector terminal of said third semiconductor device.

2. A power module comprising:
a first semiconductor device having a collector terminal and an emitter terminal which extend outwardly from a molded resin, wherein at least one of said collector and emitter terminals is a bilaterally extending terminal extending outwardly from two opposite surfaces of said molded resin;
a second semiconductor device having the same construction as said first semiconductor device;
wherein said bilaterally extending terminal of said first semiconductor device is connected to a bilaterally extending terminal of said second semiconductor device, wherein:
said first semiconductor device includes an arm including two power semiconductor elements connected in series;
said collector terminal is a P line serving as a high voltage line of said arm;
said emitter terminal is an N line serving as a low voltage line of said arm; and
said P line and said N line are said bilaterally extending terminals.

3. A power module comprising:
a first semiconductor device having a collector terminal and an emitter terminal which extend outwardly from a molded resin, wherein at least one of said collector and emitter terminals is a bilaterally extending terminal extending outwardly from two opposite surfaces of said molded resin;
a second semiconductor device having the same construction as said first semiconductor device;

wherein said bilaterally extending terminal of said first semiconductor device is connected to a bilaterally extending terminal of said second semiconductor device, wherein:

said first semiconductor device includes an arm including two power semiconductor elements connected in series; and a neutral terminal of said arm extends outwardly from directly above a neutral point of said arm within said molded resin.

4. A power module comprising:

a first semiconductor device having a collector terminal and an emitter terminal which extend outwardly from a molded resin, wherein at least one of said collector and emitter terminals is a bilaterally extending terminal extending outwardly from two opposite surfaces of said molded resin;

a second semiconductor device having the same construction as said first semiconductor device;

wherein said bilaterally extending terminal of said first semiconductor device is connected to a bilaterally extending terminal of said second semiconductor device, wherein:

said first semiconductor device constitutes the upper arm or lower arm, or both, of an arm including two power semiconductor elements connected in series; and a neutral terminal between said two power semiconductor elements is a bilaterally extending terminal.

* * * * *